United States Patent
Tsai

(10) Patent No.: US 10,264,631 B1
(45) Date of Patent: Apr. 16, 2019

(54) LIGHT SET CIRCUIT WITH TIME CONTROL FUNCTION

(71) Applicant: Cosmo Lighting Inc., Walnut, CA (US)

(72) Inventor: Nai-Chen Tsai, New Taipei (TW)

(73) Assignee: COSMO LIGHTING INC., Walnut, CA (US)

( * ) Notice: Subject to any disclaimer, the term of this patent is extended or adjusted under 35 U.S.C. 154(b) by 0 days.

(21) Appl. No.: 16/059,848

(22) Filed: Aug. 9, 2018

Related U.S. Application Data

(60) Provisional application No. 62/565,327, filed on Sep. 29, 2017, provisional application No. 62/584,619, filed on Nov. 10, 2017.

(51) Int. Cl.
*H05B 33/08* (2006.01)

(52) U.S. Cl.
CPC ..... *H05B 33/0806* (2013.01); *H05B 33/0845* (2013.01)

(58) Field of Classification Search
None
See application file for complete search history.

(56) References Cited

U.S. PATENT DOCUMENTS

| | | | | |
|---|---|---|---|---|
| 5,608,290 | A | * 3/1997 | Hutchisson | B60Q 7/00 315/185 R |
| 2016/0095180 | A1 | * 3/2016 | Miskin | H05B 33/0845 315/185 R |

* cited by examiner

*Primary Examiner* — Dedei Hammond
(74) *Attorney, Agent, or Firm* — Li & Cai Intellectual Property (USA) Office

(57) ABSTRACT

A light set circuit with time control function includes a power supply module, a plurality of light emitting modules and a time control module. A first wire receives a positive voltage and a second wire receives a negative voltage, or the first wire receives a negative voltage and the second wire receives a positive voltage, from the power supply module. A first positive pin of a first light emitting module and a second positive pin of a second light emitting module are connected to the second wire, and a first negative pin of the first light emitting module and a second positive pin of the second light emitting module are connected to the second wire. The time control module counts time and controls light emitting states of the light emitting modules.

9 Claims, 6 Drawing Sheets

LIGHT SET CIRCUIT WITH TIME CONTROL FUNCTION

FIELD OF THE DISCLOSURE

The present disclosure relates to a light set circuit, and more particularly to a light set circuit with time control function.

BACKGROUND OF THE DISCLOSURE

In a conventional light set circuit, light emitting elements in light emitting modules connected in parallel are oriented in the same direction. Therefore, positive pins of the light emitting modules are connected to one wire and always receive a positive voltage, and negative pins of the light emitting modules are connected to another wire and always receive a negative voltage. Moreover, in the conventional light set circuit, no circuit element or module is configured to control the time when the light emitting modules emit or stop emitting lights and the light emitting period/frequency.

SUMMARY OF THE DISCLOSURE

In response to the above-referenced technical inadequacies, the present disclosure provides a light set circuit with time control function that can control the timing of light emitting. In the present disclosure, positive pins of light emitting modules may receive a positive voltage or a negative voltage, and negative pins of the light emitting modules may also receive a negative voltage or a positive voltage. Therefore, the light emitting modules may not continually emit lights, and can have more variations in light emission.

In one aspect, one light set circuit provided by the present disclosure includes one or more power supply modules, a plurality of light emitting modules and one or more time control modules. The power supply module is connected to a first wire and a second wire, and is configured to provide a positive voltage and a negative voltage. The first wire receives the positive voltage and the second wire receives the negative voltage, or the first wire receives the negative voltage and the second wire receives the positive voltage. The light emitting modules are connected in parallel. A first positive pin of a first light emitting module and a second negative pin of a second light emitting module are connected to the first wire, and a first negative pin of the first light emitting module and a second positive pin of the second light emitting module are connected to the second wire. The time control module is connected between the power supply module and the light emitting modules, and is configured to count time and control light emitting states of the light emitting modules.

In one aspect, another light set circuit provided by the present disclosure includes one or more power supply modules, a plurality of light emitting modules and one or more time control modules. The power supply module is connected to a first wire, a second wire and a third wire, and is configured to provide a positive voltage and a negative voltage. The first wire receives the positive voltage or the negative voltage, the second wire receives the positive voltage or the negative voltage, and the third wire receives the positive voltage or the negative voltage. The light emitting modules include a first light emitting module and a second light emitting module. A first positive pin of the first light emitting module is connected to the first wire, a first negative pin of the first light emitting module and a second positive pin of the second light emitting module are connected to the second wire, and a second negative pin of the second light emitting module is connected to the third wire. The time control modules is connected between the power supply module and the light emitting modules, and is configured to count time and control light emitting states of the light emitting modules.

The light set circuit provided by the present disclosure has a multi-loop structure, positive pins of light emitting modules may receive a positive voltage or a negative voltage, and negative pins of light emitting modules may receive a negative voltage or a positive voltage, so that the light set circuit can have more variations of light emission and the manufacturing process of the light set circuit will be simpler, which improves the production efficiency and decreases the production cost. In addition, the time control module(s) is/are configured so that the light emitting modules can control the timing of light emitting, the time duration of light emitting and the light emitting period/frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
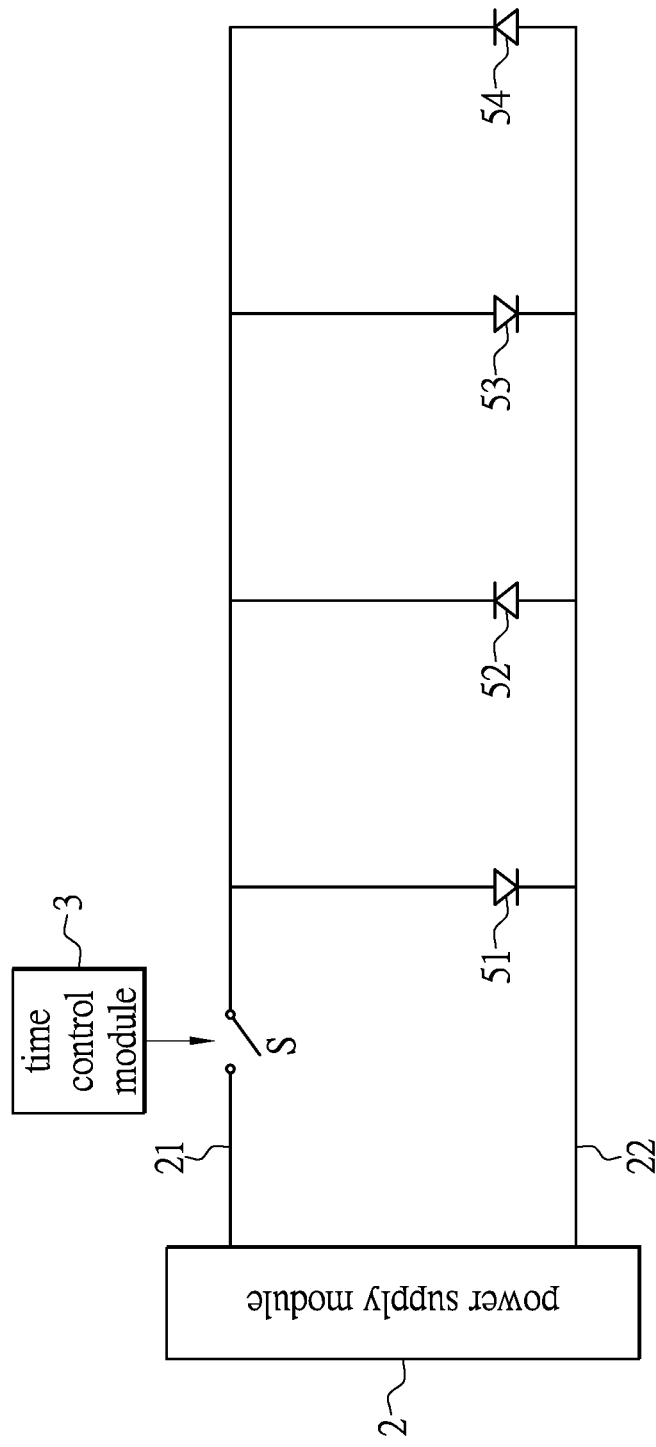
FIG. 1 is a block diagram of a light set circuit with time control function according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a light set circuit with time control function. As shown in FIG. 1, the light set circuit with time control function includes a power supply module 2, a time control module 3, a switching module S and a plurality of light emitting modules, such as a first light emitting module 51, a second light emitting module 52, a third light emitting module 53 and a fourth light emitting module 54. The power supply module 2 is connected to positive pins and negative pins of the first light emitting module 51, the second light emitting module 52, the third light emitting module 53 and the fourth light emitting module 54 to form loops. The time control module 3 is configured between the power supply module 2 and the first light emitting module 51, the second light emitting module 52, the third light emitting module 53 and the fourth light emitting module 54.

The power supply module 2 is connected to one end of the first wire 21 and one end of the second wire 22. The positive pin of the first light emitting module 51, the negative pin of the second light emitting module 52, the positive pin of the third light emitting module 53 and the negative pin of the fourth light emitting module 54 are connected to the other end of the first wire 21. The negative pin of the first light emitting module 51, the positive pin of the second light emitting module 52, the negative pin of the third light emitting module 53 and the positive pin of the fourth light emitting module 54 are connected to the other end of the second wire 22.

The first wire 21 and the second wire 22 are arranged in parallel. The first light emitting module 51, the second light emitting module 52, the third light emitting module 53 and the fourth light emitting module 54 are connected in parallel and connected between the first wire 21 and the second wire 22. For example, the first wire 21 and the second wire 22 can be copper wires, enameled wires, Teflon wires, PVC wires or can be made of other appropriate materials. In the following descriptions, the first wire 21 and the second wire 22 are copper wires, but is not limited thereto.

In a first time segment, the power supply module 2 provides a positive voltage to the first wire 21 and provides a negative voltage to the second wire 22. In a second time segment (there is a time interval between the first time segment and the second time segment), the power supply module 2 provides a negative voltage to the first wire 21 and provides a positive voltage to the second wire 22. In this manner, the first light emitting module 51, the second light emitting module 52, the third light emitting module 53 and the fourth light emitting module 54 are turned on in turns.

Instead of always providing a positive voltage or a negative voltage, in this embodiment, the first wire 21 selectively provides a positive voltage or a negative voltage, and the second wire 22 selectively provides a negative voltage or a positive voltage.

The first light emitting module 51, the second light emitting module 52, the third light emitting module 53 and the fourth light emitting module 54 can be LEDs and arranged in predetermined manners. For example, light emitting elements in the first light emitting module 51 and the third light emitting module 53 are configured in a first orientation, and light emitting elements in the second light emitting module 52 and the fourth light emitting module 54 are configured in a second orientation, wherein the first orientation and the second orientation are opposite to each other. Specifically, in this example, the positive pin of the first light emitting module 51, the positive pin of the third light emitting module 53, the negative pin of the second light emitting module 52 and the negative pin of the fourth light emitting module 54 are connected to the first wire 21. In addition, the negative pin of the first light emitting module 51, the negative pin of the third light emitting module 53, the positive pin of the second light emitting module 52 and the positive pin of the fourth light emitting module 54 are connected to the second wire 22. It should be noted that, the number, the type, the light color and the arrangement of the above light emitting modules can be adjusted according to circuit design requirements.

In a conventional light set circuit, positive pins of the light emitting modules are all connected to one wire and receive a positive voltage, and negative pins of the light emitting modules are all connected to another wire and receive a negative voltage. In this embodiment, some light emitting modules have their positive pins connected to a first wire and have their negative pins connected to a second wire, and the other light emitting modules have their positive pins connected to the second wire and have their negative pins connected to the first wire. In this manner, the first wire selectively provides a positive voltage or a negative voltage and the second wire selectively provides a negative voltage or a positive voltage, so that the first wire will not always be considered a positive pole or a negative pole and the second wire will not always be considered a negative pole or a positive pole. Since the positive pins of light emitting modules may receive a positive voltage or a negative voltage, and the negative pins of light emitting modules may receive a negative voltage or a positive voltage, the light set circuit can have more variations of light emission and the manufacturing process of the light set circuit will be simpler, which improves the production efficiency and decreases the production cost.

The time control module 3 can further include a timer, and the timer can be configured between the power supply module 2 and the first light emitting module 51, the second light emitting module 52, the third light emitting module 53 and the fourth light emitting module 54, so that the timings of light emission of the first light emitting module 51, the second light emitting module 52, the third light emitting module 53 and the fourth light emitting module 54 can be controlled, and the time durations of light emission of the first light emitting module 51, the second light emitting module 52, the third light emitting module 53 and the fourth light emitting module 54 can be timed.

To allow the light emitting states of the first light emitting module 51, the second light emitting module 52, the third light emitting module 53 and the fourth light emitting module 54 to be easily controlled by the time control module 3, a switching module S is configured and connected to the first wire 21 or the second wire 22, and the time control module 3 can selectively turn on or turn off the switching module S.

As shown in FIG. 1, the switching module S is turned off, so that the power supply module 2 and the first light emitting module 51, the second light emitting module 52, the third light emitting module 53 and the fourth light emitting module 54 form open circuits. In this case, no current flows from the power supply module 2 to the first light emitting module 51, the second light emitting module 52, the third light emitting module 53 and the fourth light emitting module 54 through the first wire 21. Also, no current flows from the power supply module 2 to the first light emitting module 51, the second light emitting module 52, the third light emitting module 53 and the fourth light emitting module 54 through the second wire 22 and back to the power supply module 2 through the first wire 21. Therefore, the first light emitting module 51, the second light emitting module 52, the third light emitting module 53 and the fourth light emitting module 54 cannot emit light when the time control module 3 turns off the switching module S.

After a predetermined time, the time control module 3 turns on the switching module S, so that the power supply module 2 and the first light emitting module 51, the second light emitting module 52, the third light emitting module 53 and the fourth light emitting module 54 form loops. In this case, for example, the power supply module 2 can provide a positive voltage through the first wire 21 and a negative voltage through the second wire 22, such that the first light emitting module 51 and the third light emitting module 53 are turned on to emit lights. The light emitted by the first light emitting module 51 and the light emitted by the third light emitting module 53 may be the same color or different colors, such as the red light, the green light or the blue light, and may be a continual light or a flashing light. In addition, no light can be emitted by the second light emitting module 52 and the fourth light emitting module 54 because they are turned off. It is worth mentioning that, the positive voltage is larger than the threshold voltages of the first light emitting module 51 and the third light emitting module 53, such as 0.7V.

A while later, the power supply module 2 can provide a positive voltage through the second wire 22 and a negative voltage through the first wire 21, such that the second light emitting module 52 and the fourth light emitting module 54 are turned on to emit lights. No light emitted by the first light emitting module 51 and the third light emitting module 53 because they are turned off. It is worth mentioning that, the positive voltage is larger than the threshold voltages of the second light emitting module 52 and the fourth light emitting module 54.

Second Embodiment

Figure 2:
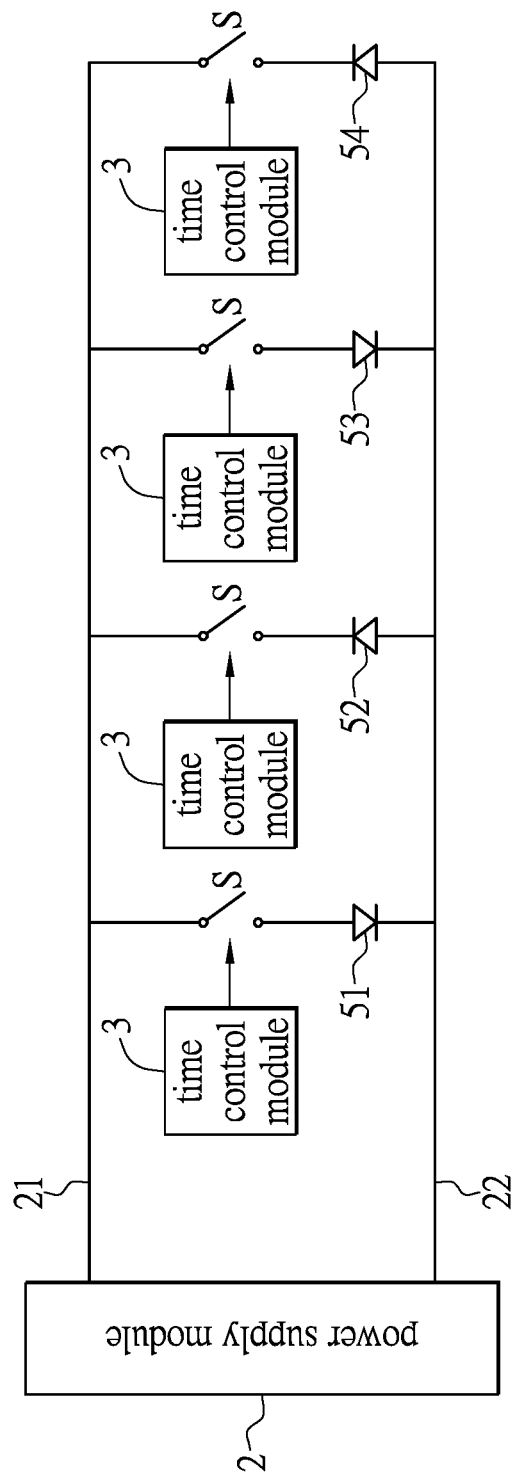
FIG. 2 is a block diagram of a light set circuit with time control function according to the second embodiment of the present disclosure.

Referring to FIG. 2, a second embodiment of the present disclosure provides a light set circuit with time control function. As shown in FIG. 2, the light set circuit with time control function includes a power supply module 2, a plurality of time control modules 3, a plurality of switching modules S and a plurality of light emitting modules, such as a first light emitting module 51, a second light emitting module 52, a third light emitting module 53 and a fourth light emitting module 54. The power supply module 2 is connected to the positive pins and negative pins of the first light emitting module 51, the second light emitting module 52, the third light emitting module 53 and the fourth light emitting module 54 to form loops. The time control module 3 is configured between the power supply module 2 and the first light emitting module 51, the second light emitting module 52, the third light emitting module 53 and the fourth light emitting module 54.

In the first embodiment, only one time control module 3 is configured to control the light emitting states of the first light emitting module 51, the second light emitting module 52, the third light emitting module 53 and the fourth light emitting module 54. Differently, in this embodiment, each of the first light emitting module 51, the second light emitting module 52, the third light emitting module 53 and the fourth light emitting module 54 is connected to a time control module 3 in serial, and the time control modules 3 control the turning on and the turning off of the switching modules S which are connected respectively to the first light emitting module 51, the second light emitting module 52, the third light emitting module 53 and the fourth light emitting module 54. It is worth mentioning that, the number of the time control modules 3 is determined by the number of the light emitting modules. Since the timing of emitting light (with or without flashes), the time duration of emitting light, the light emitting frequency and the light emitting period of each of the light emitting modules 51-54 can be controlled, the light set circuit with time control function in this embodiment can provide more variations of light emission.

Third Embodiment

Figure 3:
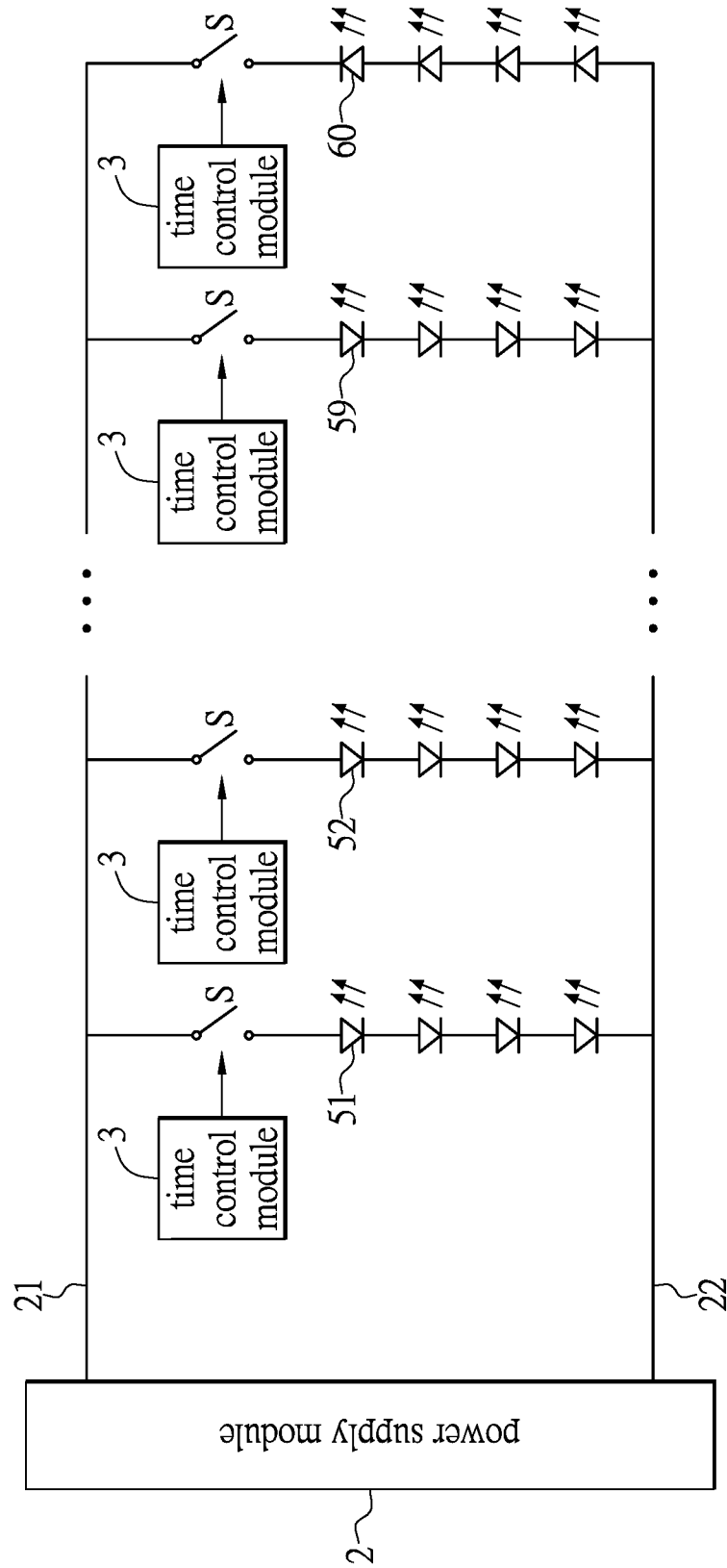
FIG. 3 is a block diagram of a light set circuit with time control function according to the third embodiment of the present disclosure.

Referring to FIG. 3, a third embodiment of the present disclosure provides a light set circuit with time control function. As shown in FIG. 3, the light set circuit with time control function includes a power supply module 2, a plurality of time control modules 3, a plurality of switching modules S and a plurality of light emitting modules, such as a first light emitting module 51, a second light emitting module 52, . . . , a ninth light emitting module 59 and a tenth light emitting module 60. The power supply module 2 is connected to positive pins and negative pins of the light emitting modules 51-60 to form loops. The time control modules 3 are connected respectively to the switching modules S, and the switching modules S are connected respectively to the light emitting modules 51-60 in serial.

In the second embodiment, each of the first light emitting module 51, the second light emitting module 52, the third light emitting module 53 and the fourth light emitting module 54 only includes one light emitting element, such as an LED. Differently, in this embodiment, each of the first light emitting module 51, the second light emitting module 52, . . . , the ninth light emitting module 59 and the tenth light emitting module 60 includes a plurality of light emitting elements connected in serial, so that the light emitting elements in each of the light emitting modules 51-60 form a light string.

The light emitting elements of the first light emitting module 51 are connected in serial in the same orientation. Specifically, in the first light emitting module 51, the negative pin of the first light emitting element is connected to the positive pin of the second light emitting element, the negative pin of the second light emitting element is connected to the positive pin of the third light emitting element, and so on. The configurations of the second light emitting module 52, the third light emitting module 53, . . . and the ninth light emitting module 59 (i.e., the arrangement of the light emitting elements) are similar. It is worth mentioning that, the light emitting elements in the tenth light emitting module 60 are also connected in serial in the same orientation, but the orientation of the light emitting elements in the first light emitting module 51 is opposite to the orientation of the light emitting elements in the tenth light emitting module 60.

The positive pin of each of the light emitting modules 51-60 can be connected to the first wire 21 or the second wire 22, and the negative pin of each of the light emitting modules 51-60 can be connected to the second wire 22 or the first wire 21. In this embodiment, the positive pin of the first light emitting module 51 and the negative pin of the tenth light emitting module 60 are connected to the same wire, which is the first wire 21, and the negative pin of the first light emitting module 51 and the positive pin of the tenth light emitting module 60 are connected to the same wire, which is the second wire 22.

In a conventional light set circuit, light emitting modules are connected in parallel, light emitting elements in each light emitting module are connected in serial in the same orientation. Therefore, positive pins of all light emitting modules are connected to one wire, and negative pins of all light emitting modules are connected to another wire. In this embodiment, the orientations of the light emitting elements in the light emitting modules can be different. Therefore, positive pins of some light emitting modules and negative pins of the other light emitting modules may be connected to the same wire. Since the positive pins of some light emitting modules may receive a positive voltage or a negative voltage, and the negative pins of the other light emitting modules may receive a negative voltage or a positive voltage, the light set circuit can have more variations of light emission and the manufacturing process of the light set circuit will be simpler, which improves the production efficiency and decreases the production cost.

Fourth Embodiment

Figure 4:
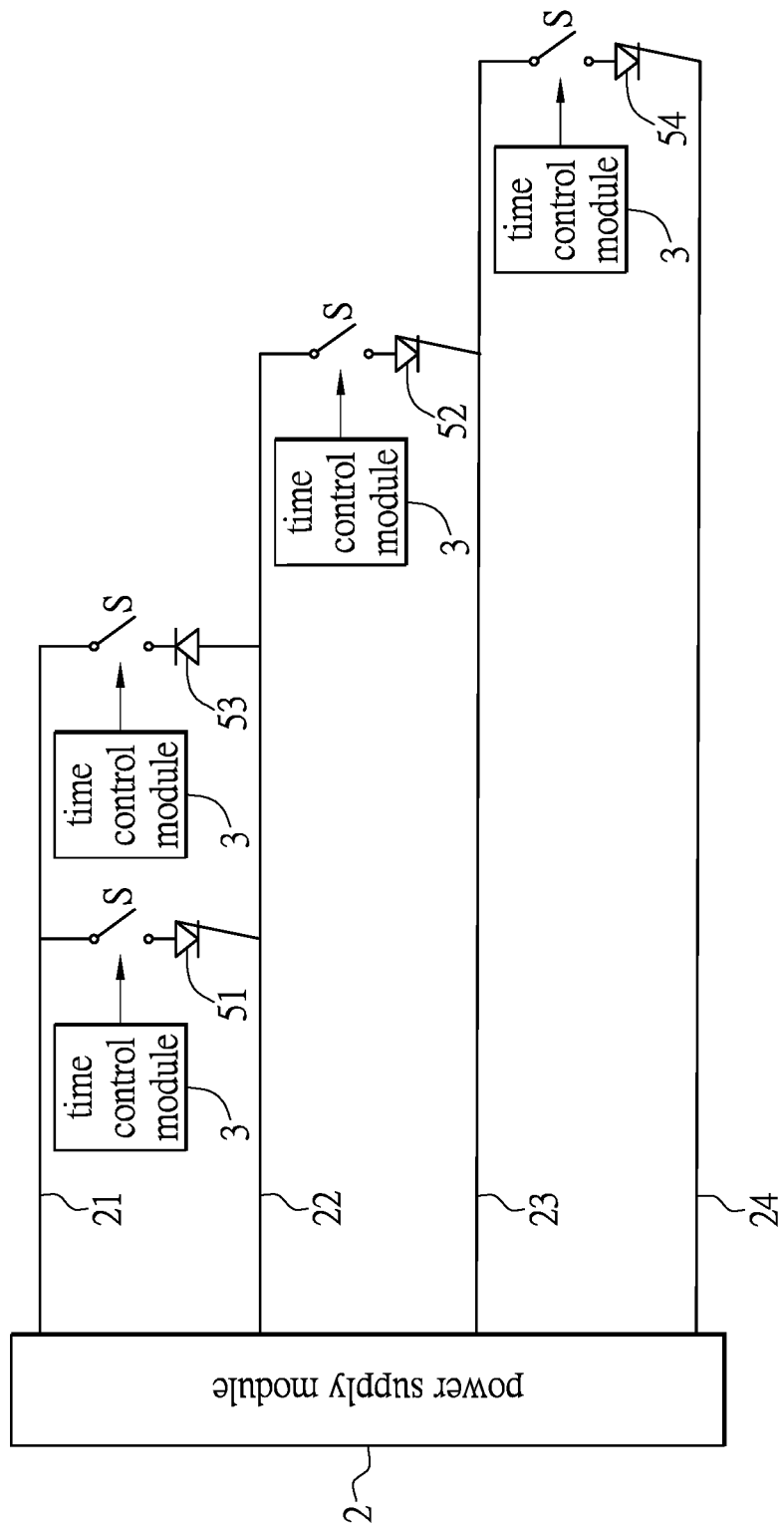
FIG. 4 is a block diagram of a light set circuit with time control function according to the fourth embodiment of the present disclosure.

Referring to FIG. 4, a fourth embodiment of the present disclosure provides a light set circuit with time control function. As shown in FIG. 4, the light set circuit with time control function includes a power supply module 2, a plurality of time control modules 3, a plurality of switching modules S and a plurality of light emitting modules, such as a first light emitting module 51, a second light emitting module 52, a third light emitting module 53 and a fourth light emitting module 54. The power supply module 2 is connected to positive pins and negative pins of the light emitting modules 51-54 to form loops. The time control modules 3 are configured between the power supply module 2 and the light emitting modules 51-54, respectively.

The light set circuit in the second embodiment is a two-wire circuit with two loops, but the light set circuit in this embodiment is a four-wire circuit with four loops.

In this embodiment, the power supply module 2 has four output ends which are connected to a first wire 21, a second wire 22, a third wire 23 and a fourth wire 24, respectively. The positive pin of the first light emitting module 51 and the negative pin of the third light emitting module 53 are connected to the first wire 21, and the negative pin of the first light emitting module 51, the positive pin of the third light emitting module and the positive pin of the second light emitting module 52 are connected to the second wire 22. The negative pin of the second light emitting module 52 and the positive pin of the fourth light emitting module 54 are connected to the third wire 23, and the negative pin of the fourth light emitting module 54 is connected to the fourth wire 24.

It is worth mentioning that, the configuration of the light set circuit is not restricted to two-wire circuits with two loops or four-wire circuits with four loops. By adjusting the types, numbers or arrangements of the wires and light emitting modules, the configuration of the light set circuit can also be three-wire circuits with two loops, three loops or four loops, four-wire circuits with three loops, four, five or six loops, or four-wire circuits with three loops or twelve loops. The colors of the lights emitted by the light emitting elements are not restricted to those disclosed herein. For example, the lights emitted by the light emitting elements can be red, blue or green. Moreover, the light emitting element can be a single LED or an LED matrix, and is not limited thereto.

Fifth Embodiment

Figure 5:
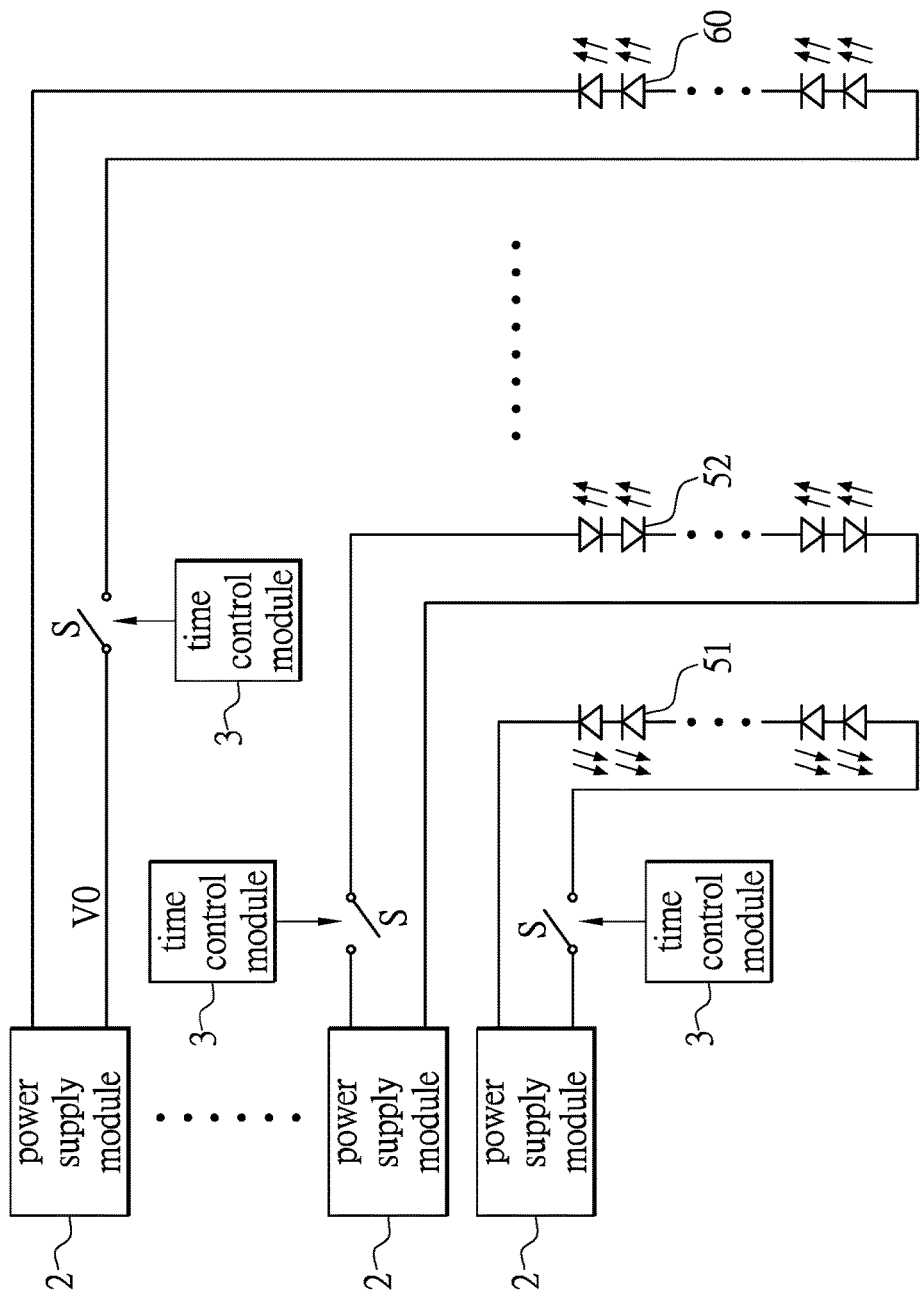
FIG. 5 is a block diagram of a light set circuit with time control function according to the fifth embodiment of the present disclosure.

Referring to FIG. 5, a fifth embodiment of the present disclosure provides a light set circuit with time control function. As shown in FIG. 5, the light set circuit with time control function includes a plurality of power supply modules 2, a plurality of time control modules 3, a plurality of switching modules S and a plurality of light emitting modules, such as a first light emitting module 51, a second light emitting module 52, . . . , a ninth light emitting module 59 and a tenth light emitting module 60. The power supply modules 2 are connected to positive pins and negative pins of the light emitting modules 51-60 to form loops. A time control module 3 is configured between one of the light emitting modules 51-60 and one power supply module 2.

In the above embodiments, only one power supply module is used to provide power to the light emitting modules. In this embodiment, each of the light emitting modules 51-60 is connected to one power supply module 2, so that the number of the power supply modules 2 is determined by the number of the light emitting modules.

One time control module 3 is connected between one power supply module 2 and the positive pin or the negative pin of one light emitting module. For example, one time control module 3 is connected to the positive pin of the first light emitting module 51 and one power supply module 2. The number of the time control modules 3 is determined by the number of the power supply modules 2 and the number of the light emitting modules 51-60. Each time control module 3 can control its corresponding power supply module 2 and its corresponding light emitting module (i.e., one of the light emitting modules 51-60) to form a loop.

In other embodiments, the number of the time control modules 3 can be more than or less than the number of the light emitting modules. For ease of illustration, in this embodiment, the number of the time control modules is equal to the number of the light emitting modules. Each of the light emitting modules 51-60 is connected to one time control module 3. The time control modules 3 control the timing of light emission and the light emitting efficiency of the light emitting modules 51-60 respectively in a synchronous way or an asynchronous way, so that the light emitting states of the light emitting modules 51-60 can be the same or different.

Sixth Embodiment

Figure 6:
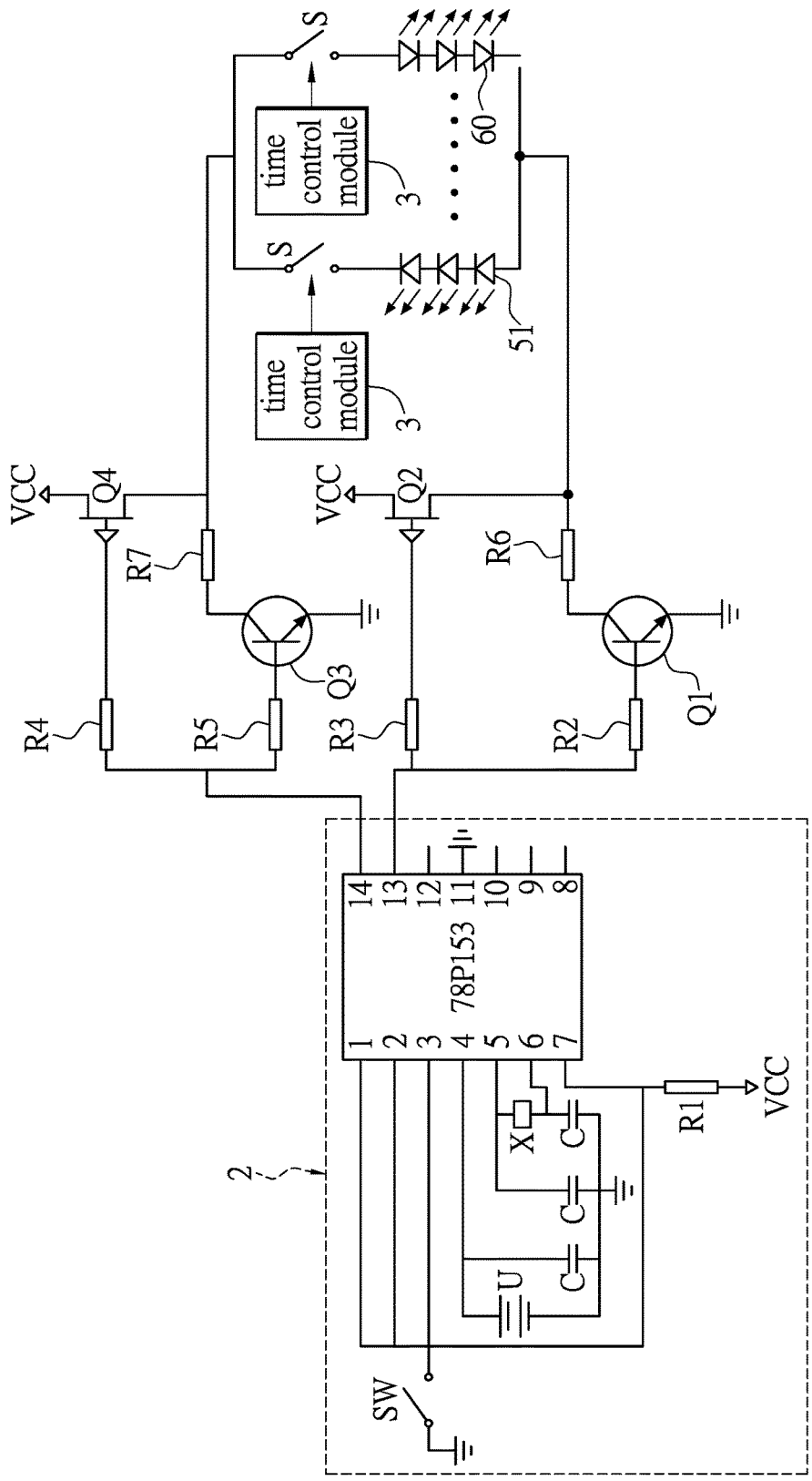
FIG. 6 is a circuit diagram of a light set circuit with time control function according to the sixth embodiment of the present disclosure.

Referring to FIG. 6, a sixth embodiment of the present disclosure provides a light set circuit with time control function. As shown in FIG. 6, the light set circuit with time control function includes a power supply module 2, a plurality of time control modules 3, a plurality of switching modules S and a plurality of light emitting modules, such as a first light emitting module 51, a second light emitting module 52, . . . , a ninth light emitting module 59 and a tenth light emitting module 60.

The power supply module 2 includes a switching module SW, a single chip microcontroller 78P153 and an oscillation circuit having a plurality of capacitors C and resonators X.

The oscillation circuit has an independent power supply U, and the independent power supply U is connected to a fourth pin of the single chip microcontroller 78P153, so that the single chip microcontroller 78P153 can output a high voltage or a low voltage at different frequencies. The gate of the FET (Field-Effect Transistor) Q4 and the base of the CMOSFET (Complementary Metal-Oxide-Semiconductor Field-Effect Transistor) Q3 are connected to a $14^{th}$ pin of the single chip microcontroller 78P153 respectively through a resistor R4 and a resistor R5. The drain of the FET Q4 and the collector of the CMOSFET Q3 are connected through a resistor R7. The emitter of the CMOSFET Q3 is grounded. The gate of the FET Q2 and the base of the CMOSFET Q1 are connected to a $13^{th}$ pin of the single chip microcontroller 78P153 respectively through a resistor R3 and a resistor R2. The drain of the FET Q2 and the collector of the CMOSFET Q1 are connected through a resistor R6, and the emitter of the CMOSFET Q2 is grounded.

One switching module S is configured for one light emitting module. In FIG. 6, the negative pin of the first light emitting element in the first light emitting module 51 is connected to one switching module S, and the positive pin of the first light emitting element in the tenth light emitting module 60 is also connected to one switching module S. The circuit formed by the first light emitting module 51 and its corresponding switching module S and the circuit formed by the tenth light emitting module 60 and its corresponding switching module S are connected in parallel. These switching modules S are also connected to the drain of the FET Q4 and the collector of the CMOSFET Q3. The positive pin of the last light emitting element in the first light emitting module 51 and the negative pin of the last light emitting element in the tenth light emitting module 60 are connected to the drain of the FET Q2 and the collector of the CMOSFET Q1.

Moreover, each of the light emitting modules 51-60 is connected to one time control module 3. The time control module 3 can control the turning on and turning off of its corresponding switching module S, so that the light emitting state of each light module can be controlled. For example, the time control module 3 can turn on the switching module S connected to the first light emitting module 51 when the voltage at the $14^{th}$ pin of the single chip microcontroller 78P153 is a high voltage, the voltage at the $13^{th}$ pin of the single chip microcontroller 78P153 is a low voltage, the CMOSFET Q3 is not turned on, the CMOSFET Q1 is turned on, the control voltage of the FET Q4 is a high voltage, and the control voltage of the FET Q2 is a low voltage. The switching module S connected to the first light emitting module 51 may be turned on for five seconds, then turned off for three seconds, and again turned on for five seconds. In this case, the first light emitting module 51 emits lights every three seconds, and its time duration of emitting light is five seconds, so that the first light emitting module 51 can emit a flashing light. For another example, the time control module 3 can turn on the switching module S connected to the tenth light emitting module 60 when the voltage at the $14^{th}$ pin of the single chip microcontroller 78P153 is a low voltage and the voltage at the $13^{th}$ pin of the single chip microcontroller 78P153 is a high voltage. The switching module S connected to the tenth light emitting module 60 may be turned on for 10 seconds, so that the tenth light emitting module 60 can emit light for 10 seconds. At the same time, the light emitting states of the other light emitting modules can be controlled to be the same or different. It should be noted that, to have more variations of light emission, the number of the light emitting modules can be adjusted and the light emitting states of the light emitting modules can also be adjusted.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light set circuit with time control function, comprising:
   one or more power supply modules, connected to a first wire and a second wire, providing a positive voltage and a negative voltage, wherein the first wire receives the positive voltage and the second wire receives the negative voltage, or the first wire receives the negative voltage and the second wire receives the positive voltage;
   a plurality of light emitting modules, wherein the light emitting modules are connected in parallel, a first positive pin of a first light emitting module and a second negative pin of a second light emitting module are connected to the first wire, and a first negative pin of the first light emitting module and a second positive pin of the second light emitting module are connected to the second wire; and
   a plurality of time control modules, connected between the power supply module and the light emitting modules, counting time and controlling light emitting states of the light emitting modules,
   wherein the time control modules are connected respectively to the light emitting modules, and each of the time control modules controls a light emitting time and a frequency of the corresponding light emitting module according to a preset time.

2. The light set circuit according to claim 1, further comprising a plurality of switching modules, wherein the switching modules are connected respectively to the light emitting module in serial and are connected respectively to the time control modules;
   wherein the time control modules respectively control the turning on and the turning off of the switching modules according to the same preset time or different preset times, such that the light emitting time and the frequency of each light emitting module are controlled.

3. The light set circuit according to claim 1, wherein the power supply modules are connected respectively to the time control modules, and the number of the power supply modules and the number of the time control modules is related to the number of the light emitting modules.

4. The light set circuit according to claim 1, wherein the first light emitting module includes a plurality of first light emitting elements connected in serial in the same orientation, the second light emitting module includes a plurality of second light emitting elements connected in serial in the same orientation, the first light emitting elements are connected to the second light emitting elements in parallel, and the orientation of the first light emitting elements is the same or different from the orientation of the second light emitting elements.

5. A light set circuit with time control function, comprising:
one or more power supply modules, connected to a first wire, a second wire and a third wire, providing a positive voltage and a negative voltage, wherein the first wire receives the positive voltage or the negative voltage, the second wire receives the positive voltage or the negative voltage, and the third wire receives the positive voltage or the negative voltage;
a plurality of light emitting modules, including a first light emitting module and a second light emitting module, wherein a first positive pin of the first light emitting module is connected to the first wire, a first negative pin of the first light emitting module and a second positive pin of the second light emitting module are connected to the second wire, and a second negative pin of the second light emitting module is connected to the third wire; and
one or more time control modules, connected between the power supply module and the light emitting modules, counting time and controlling light emitting states of the light emitting modules.

6. The light set circuit according to claim 5, wherein the time control modules are connected respectively to the light emitting modules, and each time control module controls a light emitting time and a frequency of the corresponding light emitting module according to a preset time.

7. The light set circuit according to claim 6, further comprising a plurality of switching modules, wherein the switching modules are connected respectively to the light emitting module in serial and are connected respectively to the time control modules;
wherein the time control modules respectively control the turning on and the turning off of the switching modules in the same preset time or different preset times, such that the light emitting time and the frequency of each light emitting module are controlled.

8. The light set circuit according to claim 6, wherein the power supply modules are connected respectively to the time control modules, and the number of the power supply modules and the number of the time control modules is related to the number of the light emitting modules.

9. The light set circuit according to claim 5, wherein the first light emitting module includes a plurality of first light emitting elements connected in serial in the same orientation, the second light emitting module includes a plurality of second light emitting elements connected in serial in the same orientation, the first light emitting elements are connected to the second light emitting elements in parallel, and the orientation of the first light emitting elements is the same or different from the orientation of the second light emitting elements.

* * * * *